United States Patent [19]

Fujioka

[11] Patent Number: 4,952,113

[45] Date of Patent: Aug. 28, 1990

[54] CHIP FEEDER FOR CHIP MOUNTER

[75] Inventor: Teruhiko Fujioka, Tokyo, Japan

[73] Assignee: Tenryu Technics Co., Ltd., Shizuoka, Japan

[21] Appl. No.: 270,962

[22] Filed: Nov. 14, 1988

[51] Int. Cl.$^5$ ............................................. H05K 13/04
[52] U.S. Cl. .................................. 414/416; 414/411; 414/225; 29/740; 226/62; 226/151
[58] Field of Search ............... 414/403, 411, 416, 225, 414/627; 226/62, 147, 151, 25; 242/76; 29/740, 741, 759

[56] References Cited

U.S. PATENT DOCUMENTS

| 3,608,175 | 12/1969 | Lambrecht | 414/416 X |
| 4,610,083 | 9/1986 | Campisi et al. | 414/225 X |
| 4,768,915 | 9/1988 | Fujioka | 414/416 |

FOREIGN PATENT DOCUMENTS

| 0236225 | 9/1987 | European Pat. Off. | |
| 3539696 | 5/1987 | Fed. Rep. of Germany | 414/416 |
| 56-67768 | 6/1981 | Japan | 29/740 |
| 61-229717 | 10/1986 | Japan | 414/416 |

Primary Examiner—Robert J. Spar
Assistant Examiner—John VandenBosche
Attorney, Agent, or Firm—Rodman & Rodman

[57] ABSTRACT

A chip feeder for supplying a multiplicity of chip parts retained on a tape from a tape supply section to a parts takeout section of a chip mounter. The chip feeder comprises: a working lever having a first, second and third arm portions; a driving source for applying working force to the first arm portion; a tape feed device interlockingly connected to the second arm portion, for intermittently feeding the tape at a predetermined pitch; a protective tape peel-off device interlockingly connected to the third arm portion, for peeling the protective tape off the tape intermittently fed, and a chip takeout device for taking out the chip parts from the tape. The driving source and the chip takeout device are, respectively, a driving source and a chip takeout device for the chip mounter itself, and the working lever is interlocked in operation with the chip mounter.

10 Claims, 3 Drawing Sheets

CHIP FEEDER FOR CHIP MOUNTER

BACKGROUND OF THE INVENTION

1. Field of the Invention

The present invention relates to techniques of supplying chip parts, and more particularly to techniques effective for supplying chip-shaped electronic parts to a chip mounter.

2. Related Art Statement

It is thought of that, when electronic parts such as a semiconductor, a resistor and a capacitor, which are formed into chip shapes, are mounted onto a printed circuit board or the like, a tape which retains thereon chip parts in a row at a predetermined interval is intermittently fed from a tape supply section such as a tape reel into a chip takeout section, where the chip parts are taken out from the tape and fed to a chip mounter by which chip parts are mounted onto the printed circuit board.

However, in general, according to techniques of this type, a driving source for supplying chip parts is provided separately from a driving source for the chip mounter. Because of this, a chip feeder suffers from the great problem that the chip feeder becomes complicated in construction and large in size, thus resulting in costs increase.

Then, the present inventor proposed a chip feeder (U.S. Pat. No. 4,768,915) simplified in construction and compact in size and produced at reduced costs. This chip feeder is arranged such that a tape guide interval can be changed in accordance with a change in the width of the tape, and a tape feed pitch can be changed in accordance with a change of a pitch of a row in which the chip parts are arranged.

The inventor of the present invention devoted himself to the study of the chip feeder of this type and found that the following problems were to be solved.

Firstly, in a tape, to retain chip parts in chip parts holding holes of a retaining tape, i.e. a main body of the tape, the chip parts are covered by a protective tape or a seal tape, so that this protective tape should be peeled off from the retaining tape when the chip parts are taken out. When the protective tape, which has been peeled off, is merely left suspended, the problems are presented that a worker is entangled with the protective tape and his smooth working is obstructed, or static electricity is accumulated.

Secondly, the chip parts are taken out in the chip parts takeout position after the protective tape has been peeled off, and, there is a possibility that the chip parts jump out of or dislodge from the chip parts holding holes due to external force such as vibrations during a move from the peel-off position to the takeout position.

Thirdly, when the thickness of the tape is changed due to a change of thickness of the chip parts, an error during production or the like, if this change in the thickness is not properly absorbed, then, there is a possibility that takeout of the chip parts from the retaining tape or feed of the tape becomes unreliable.

SUMMARY OF THE INVENTION

It is an object of the present invention to provide a chip feeder for a chip mounter being simplified in construction and compact in size.

It is another object of the present invention to provide a chip feeder for a chip mounter, preventing that the suspended protective tape which has been peeled off from a retaining tape obstructs the working or accumulates static electricity.

It is a further object of the present invention to provide a chip feeder for a chip mounter, capable of preventing jumping of the chip parts out of the retaining tape after the protective tape has been peeled off from the retaining tape.

It is a still further object of the present invention to provide a chip feeder for a chip mounter, capable of absorbing a change in thickness of a tape properly.

The chip feeder of the chip mounter according to the present invention is arranged such that the chip feeder has a working lever including first, second and third arm portions, and working force given by a driving source of the chip mounter itself is applied to the first arm portion, whereby the working lever is driven by the driving force from the driving source of the chip mounter. An intermittent tape feed means is interlockingly connected to the second arm portion and a protective tape peel off means is interlockingly connected to the third arm portion, so that the tape feed means and the protective tape peel-off means are interlockingly operated with each other.

Furthermore, the tape feed means is constructed as a tape feed pawl interlockingly connected to the second arm portion of the working lever, and a portion of the tape feed pawl is in abutting contact with a shutter member for covering a chip parts holding portion of the tape in a manner to prevent the chip parts from jumping out of the chip parts holding portion after a protective tape has been peeled off, so as to bias the shutter member in a direction in which the chip parts are held, against biasing force of a spring.

Further, the protective tape peel off means has a take-up reel for peeling off the protective tape from the tape by a predetermined length and for taking up the same.

Furthermore, the tape intermittently fed by a tape feed means is guided while being clamped at the upper and under surface thereof by a fixed guide means and a movable guide means, respectively, and moreover, the movable guide means is supported by a resilient means flexing in a tape feeding direction in accordance with the thickness of the tape, such for example as a pair of sheet springs inclined in the tape feeding direction.

By the above-described means, the driving force for the chip feeder is applied by the driving source of the chip mounter itself, so that a structure simplified in construction and compact in size can be obtained as compared with the structure in which the chip feeder itself is independently provided with a special driving source.

Furthermore, the provision of the shutter member for preventing the chip parts from jumping out of the tape, from which the protective tape has been peeled off, enables takeout of the chip parts by a chip parts takeout means to be reliably carried out.

Further, the provision of a take-up reel interlocked with the working lever enables the protective tape, which has been peeled off, to be prevented from being suspended and obstructing the working.

Furthermore, the tape being fed is guided while being clamped at the both surfaces thereof by the fixed guide means and the movable guide means, respectively, and the movable guide means is supported by the resilient means flexing in the tape feeding direction, whereby, even when the thickness of the tape is changed, the change in the thickness can be absorbed by the movable guide means, so that the chip feeder can be widely used for the tapes of various types having a large scope of the thicknesses, and takeout of the chip parts from the tape can be carried out reliably at all times.

Hereinafter, the present invention is exemplified by one embodiment shown in drawings, which is, however, not intended to limit the invention.

DETAILED DESCRIPTION OF THE INVENTION

The chip feeder for chip mounter in this embodiment is arranged such that chip parts 4 such as chip-shaped electronic parts are supplied from a tape supply section 1 to a chip parts takeout section 3 of a chip mounter 2.

Figure 5:
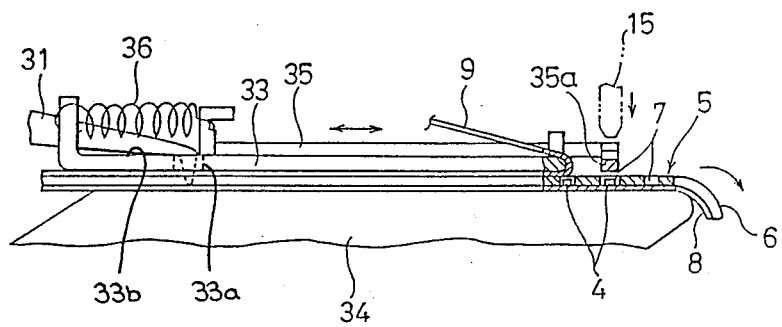
FIG. 5 is an enlarged partially sectional view showing the tape feed section and the chip parts takeout section.

As shown in FIG. 5, the chip parts 4 are received in chip parts holding holes 7 formed in a retaining tape 6 of a tape 5 at a predetermined pitch, the undersurface of the holding holes 7 are supported by a support tape 8 so that the chip parts 4 do not fall off, and, the top surface is covered by a protective tape 9 and retained so that the chip parts 4 do not jump out of the chip parts holding holes 7.

The tape 5, on which a multiplicity of chip parts 4 are held in a row at a predetermined pitch is wound around a reel 10 which is rotatably mounted on a frame 11 in the tape supply section 1.

Figure 1:
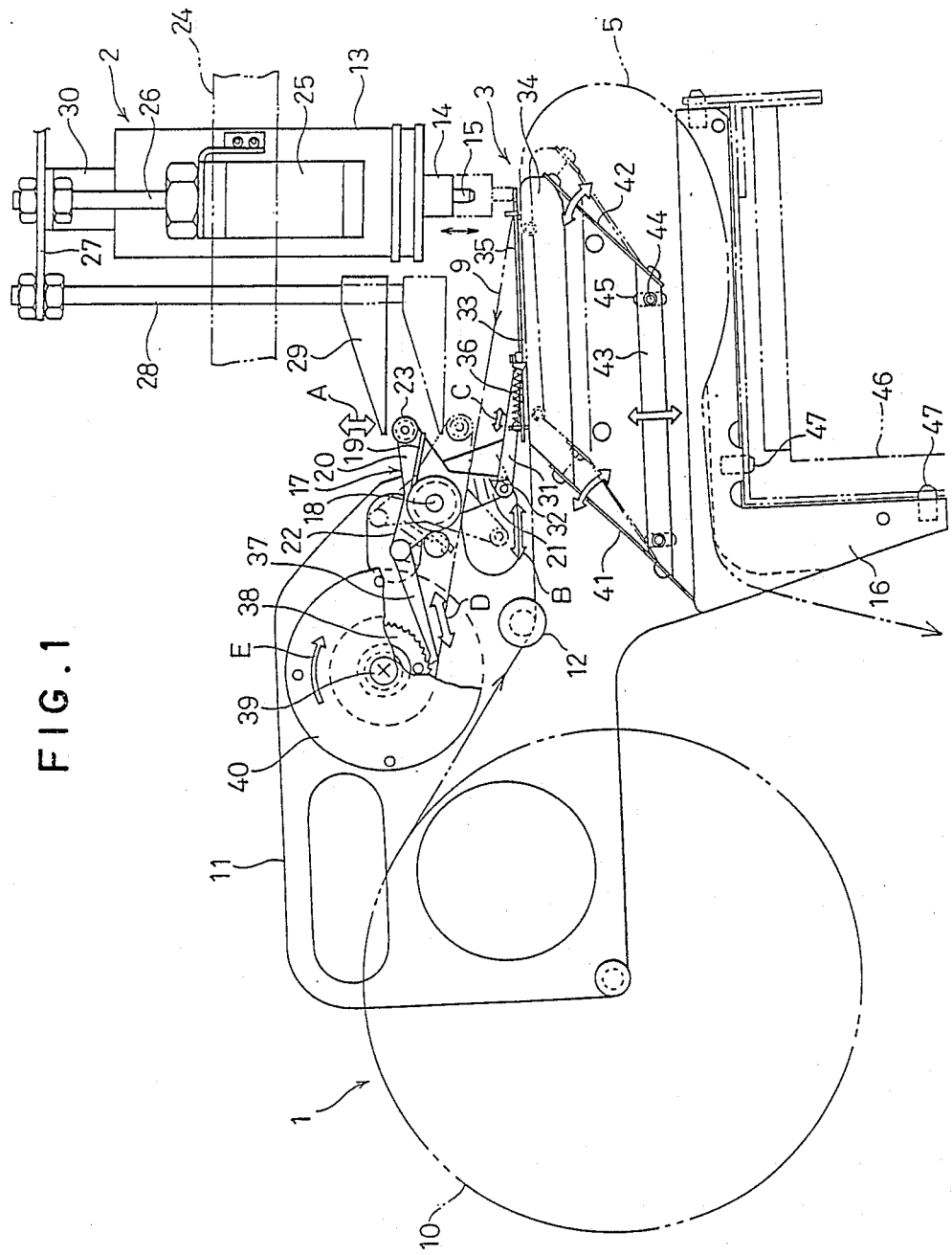
FIG. 1 is a front elevational view showing one embodiment of the chip feeder for chip mounter according to the present invention.
Figures 2, 3, 4:
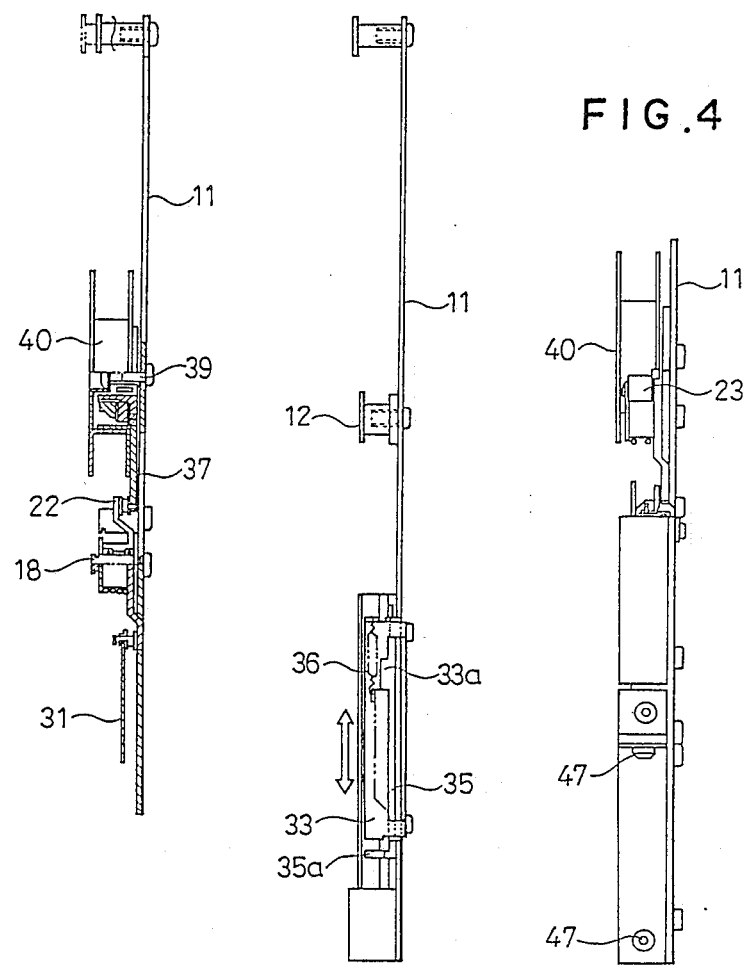
FIG. 2 is a fragmentary plan view, partially shown in section, of the tape feed pawl and the protective tape take up reel thereof.
FIG. 3 is a fragmentary plan view, partially shown in section, of the shutter member and fixed guide plate thereof.
FIG. 4 is a right-hand side view thereof.

The tape 5 is unwound through a roller 12 from the reel 10, passed through the chip parts takeout section 3, the chip parts 4 thereof are sucked by a vacuum sucker nozzle 15 of a chip parts takeout member 14 positioned at the bottom end of a main body 13 of the chip mounter 2 and taken out of the chip parts holding holes 7, and thereafter, the vacant retaining tape 6 and the support tape 8 are passed through a block 16 of the frame 11 and led to a position rightwardly and downwardly of the reel 10 as viewed in FIG. 1, for dispersal.

On the other hand, the working lever 17 is mounted on the frame 11 at a position rightwardly and upwardly of a mounted position of the roller 12 as viewed in FIG. 1 in a state where a working lever 17 is rotatable about a pin 18 in the clock wise direction from a position indicated by solid lines to a position indicated by two-dot chain lines and biased by a spring 19 in the counter-clock-wise direction. This working lever 17 has a first, a second and a third arm portions 20, 21 and 22, which extend outwardly, making an angle of about 120° with one another.

Vertically mounted on the first arm portion 20 of the working lever 17 is a roller 23. This roller 23 is applied thereto with downward driving force in a direction indicated by an arrow A by a working head 29 in response to the vertical movement of a piston rod 26 of an air cylinder 25 (driving source) provided on a frame 24 of the chip mounter through an arm 27 and a rod 28. In other words, the driving force to the working lever 17 is commonly applied by the air cylinder 25 which is the driving source for the chip mounter 2 itself. Accordingly, an independent driving source for the chip feeder itself does not exist in this embodiment, so that the feeder as a whole is simplified in construction and compact in size.

In addition, the piston rod 26 of the air cylinder 25 is connected to the main body 13 of the chip mounter 2 through an arm 30 such that the main body 13 is vertically and interlockingly operated with the working head 29.

On the other hand, the second arm portion 21 of the working lever 17 is interlockingly connected at the forward end portion thereof to a tape feed pawl 31 (tape feed means) for intermittently feeding the tape. This tape feed pawl 31 is biased in the clock-wise direction by a spring 32.

The forward end of the tape feed pawl 31 is brought into meshing engagement with the pitch hole, not shown, of the tape 5 being guided while being clamped at the both upper and under surfaces thereof by a fixed guide plate 33 on the upper surface and a guide block 34 (movable guide means) on the under surface, whereby the tape 5 is intermittently pitch-fed by a predetermined length. When the forward end of the tape feed pawl 31 is displaced from a notch 33a (Refer to FIG. 5) of the fixed guide plate 33, the forward end of the pawl 31 runs over the upper surface 33b of the fixed guide plate 33 and is released from the meshing engagement with the pitch hole (not shown) of the tape 5.

The forward end face of the tape feed pawl 31 is brought into abutting contact with a shutter member 35, whereby the shutter member 35 is biased in the tape feeding direction (to the right direction in FIG. 1) against biasing force of a tensile spring 36 stretched across the shutter member 35 and the fixed guide plate 33. This shutter member 35 is intended for preventing the chip parts from jumping out of the chip parts holding holes 7 of the retaining tape 6 after the protective tape 9 has been peeled off. For this reason, the forward end of the shutter member 35 (in the right in FIGS. 1 and 5) is vertically bent in the widthwise direction of the tape 5 relative to the tape feeding direction, and this bent portion covers the upper side of the chip parts holding holes 7 as a shutter portion 35a so as to prevent the chip parts 4 from jumping up. When the shutter member 35 is not biased by the forward end of the tape feed pawl 31 in the ape feeding direction, the shutter member 35 is pulled by the tensile force of the tensile spring 36 in a direction opposite to the tape feeding direction.

Further, the third arm portion 22 of the working lever 17 is interlockingly connected to a pawl 37, the forward end of the pawl 37 is engaged with a pawl of a ratchet wheel 38 mounted on the frame 11 to thereby intermittently rotate the ratched wheel 38 only in one direction, that is, the clock-wise direction. This ratchet wheel 38 is rotated about a pin 39 interlocking with a take-up reel 40 for taking up the protective tape 9.

More specifically, when the third arm portion 22 of the working lever 17 turns in the counterclock-wise direction, due to the presence of the pawl 37, the ratchet wheel 38 intermittently turns in the clock wise direction, and, in an interlocked operation therewith, the take-up reel 40 also rotates in the clock-wise direction, whereby the protective tape 9, which has been peeled off from the retaining tape 6, is turned back by the forward end of the fixed guide pate 33 (at the right end in FIG. 1) towards the take-up reel 40 and intermittently taken up around the take up reel 40 by a predetermined length. Accordingly, in this embodiment, it is possible to avoid that the suspended protective tape 9, which has been peeled off, obstructs the working and static electricity is accumulated.

Furthermore, as shown in FIG. 1, the guide block 34 (movable guide means) is resiliently flexibly supported by a pair of sheet springs (resilient means) 41 and 42 parallel to each other. The sheet springs 41 and 42 are inclined in the feeding direction of the tape 5 to apply biasing force in a direction of return to the tape 5.

The bottom end portions of the both sheet springs 41 and 42 are mounted on an adjusting block 43. A position of the adjusting block 43, which is mounted by means of a screw 44, is changed along a slot 45 of the frame 11, so that biasing force applied to the guide block 34 from the sheet springs 41 and 42 can be adjusted. The both blocks 34 and 43 are in parallel to each other, and so the both sheet springs 41 and 42 are. Thus, blocks 34, 43 and sheet springs 41, 42 form a parallelogrammatic shape.

Incidentally in the right-hand lower portion of FIG. 1, the frame 11 can be detachably mounted on a base 46 of the chip mounter 2 by means of a pin 47.

Action of this embodiment will hereunder be described.

First, the chip parts 4 arranged at a predetermined pitch are received in the chip parts holding holes 7 of the tape 5, the upper surface of which is covered by the protective tape 9. The tape 5 is wound around the reel 10, which is rotatably mounted on the frame 11 in the tape supply section 1. Then, as indicated by two-dot chain lines in FIG. 1, the tape 5 is guided through the roller 12, the fixed guide plate 33 and the guide block 34 and further around the block 16.

The chip feeder in this embodiment operates as follows. When the piston rod 26 of the air cylinder 25 as being the driving source for the chip mounter 2 is lowered from a state shown in FIG. 1 by a predetermined stroke, the main body 13 of the chip mounter 2, the chip parts takeout member 14 and the sucker nozzle 15 are lowered together with the piston rod 26 from a position indicated by solid lines to position indicated by two-dot chain lines in FIG. 1 through the arm 30.

In an interlocked operation therewith, the working head 29 of the chip mounter 2 is also lowered together with the piston rod 26 from a position indicated by solid lines to a position indicated by two-dot chain lines through the arm 27 and the rod 28.

In an interlocked operation with this lowering movement of the working head 29, the head 29 pushes the roller 23 of the first arm portion 20 of the working lever 17 in a direction indicated by an arrow A in FIG. 1, whereby the second arm portion 21 of the working lever 17 turns in the clock-wise direction as indicated by an arrow B against biasing force of the spring 19 from a position indicated by solid lines to a position indicated by two-dot chain lines in FIG. 1.

With this operation, the tape feed pawl 31 interlockingly connected to the second arm portion 21 is pulled in a direction indicated by an arrow C. As the result, the shutter member 35, which has been pressed by the forward end of the tape feed pawl 31, is released from the pressing force of the tape feed pawl 31 and moved by tensile force of the tensile spring 36 by a predetermined distance to the left in FIG. 1. With this operation, the shutter portion 35a provided at the forward end of the shutter member 35 moves from the position over the chip parts holding hole 7 of the tape 5, at which the chip parts 4 are prevented from jumping off, to a direction opposite to the tape feeding direction, that is, to return to the left in FIG. 1 by one pitch of the chip parts holding holes 7.

This movement of the shutter member 35 is interlocked with the operation of the sucker nozzle 15 of the chip mounter 2, whereby, immediately before the sucker nozzle 15 is lowered to a position indicated by two-dot chain lines in FIG. 1, the shutter portion 35a of the shutter member 35 is shifted to the left in FIG. 1 from the position covering the chip parts holding hole 7 where the chip parts to be sucked up is contained. Accordingly, the sucker nozzle 15 lowered to a position just over the chip parts holding hole 7 without interfering with the shutter portion 35a, sucks the chip parts in the holding hole 7 by vacuum sucking force from a vacuum source, not shown, and prepares for transferring the chip parts to a chip mount position.

Being interlocked with these operations, the pawl 37 interlockingly connected to the third arm portion 22 of the working lever 17 is subject to tensile force in a direction indicated by an arrow D to move to the right in FIG. 1.

Subsequently, when the piston rod 26 of the air cylinder 25 of the chip mounter 2 is raised, the pressing force of the working head 29 applied to the roller 23 of the first arm portion 20 is released, the working head 29, the sucking nozzle 15 and the like returning from the position indicated by the two-dot chain lines to the position indicated by the solid lines in FIG. 1. Along with this, the working lever 17 is rotated and returns from the position indicated by the two-dot chain lines to the position indicated by the solid lines in FIG. 1 by biasing force of the spring 19.

With this operation, the tape feed pawl 31 interlockingly connected to the second arm portion 21 of the working lever 17 moves in the tape feeding direction, the forward end thereof is inserted into a pitch feed hole, not shown, of the tape 5 and intermittently feeds the tape 5 by one pitch, and drives the shutter member 35 in the tape feeding direction against the tensile force of the tensile spring 36.

At this time, the forward end portion of the pawl 37 interlockingly connected to the third arm portion 22 of the working lever 17 intermittently rotates the ratchet wheel 38 through a predetermined angle in the clockwise direction. With this operation, the take-up reel 40 intermittently turns in the clock-wise direction, that is, in a direction indicated by an arrow E to peel the protective tape 9 off from the retaining tape 6 and the protective tape 9 is taken up by the take-up reel 40. Simultaneously with this, the chip parts 4 exposed from the state of being covered by the protective tape 9 is fed by one pitch by the tape feed pawl 31 together with the tape 5, the chip parts being in a state of being covered by the shutter portion 35a of the shutter member 35.

By repeating the same interlocking operations as described above, the chip parts 4, are intermittently fed together with the tape 5 by one pitch, and taken out of the chip parts holding holes 7 by the sucker nozzle 15 of the chip mounter 2, and thereafter, delivered to the chip mount position of the printed circuit board or the like by a means, not shown, and then mounted.

Incidentally, the present invention is not limited to the above embodiment, and various other modifications can be adopted.

For example, a hydraulic cylinder, a motor or the like can be used in place of the air cylinder as being the driving source.

The meritorious effects of the present invention will described below.

(1) The present invention can provides the chip feeder for supplying the multiplicity of chip parts retained on the tape from the tape supply section to the chip parts takeout section of the chip mounter comprising: a working lever having the first, second and third arm portions; the driving source for applying the working force to the first arm portion of the working lever; the tape feed means interlockingly connected to the second arm portion of the working lever, for intermittently feeding the tape at the predetermined pitch; the protective tape peel-off means interlockingly connected to the third arm portion of the working lever, for peeling off the protective tape from the tape intermittently fed by the tape feed means; and the chip parts takeout means for taking out the chip parts from the tape, from which the protective tape has been peeled off; wherein the driving source and the chip parts takeout means are the driving source and the chip parts takeout means of the chip mounter itself, respectively, and the operation of the working lever is interlocked with the operation of the chip mounter, whereby the driving force of the chip feeder is obtained from the driving source of the chip mounter itself, so that the chip feeder can be simplified in construction and compact in size as compared with the structure independently provided with its own driving source.

(2) The shutter member for covering the chip parts holding portion is provided for preventing the chip parts from jumping out of the holding portion after the protective tape has been peeled off, so that the chip parts can be prevented from falling off from the tape and takeout of the chip parts by the chip parts takeout means of the chip mounter can be reliably carried out.

(3) The protective tape after the peel-off is taken up by the take-up reel, so that obstruction to the working by the suspended protective tape peeled off can be avoided and accumulation of static electricity can be prevented.

(4) The tape is guided while being clamped at the both upper and under surfaces thereof by the fixed guide means on the upper surface and the movable guide means on the under surface, and the movable guide means is supported by the resilient means flexing in the tape feeding direction in accordance with the thickness of the tape, whereby, even when the thickness of the tape is changed, the change in the thickness can be absorbed by the movable guide means, so that the above arrangement can be applied to the various tapes having various thicknesses, for the general purpose, and takeout of the chip parts can be reliably carried out at all times because the chip parts takeout position can be held constant.

What is claimed is:

1. A chip feeder for chip mounter for supplying a multiplicity of chip parts retained on a tape, including a protective tape portion, from a tape supply section to a chip parts takeout section of said chip mounter, comprising:

a working lever having a first, a second and a third arm portion;

a driving source for applying a driving force to said first arm portion of the working lever;

a tape feed means interlockingly connected to said second arm portion of the working lever, for intermittently feeding the tape at a predetermined pitch;

a protective tape peel-off means interlockingly connected to said third arm portion of the working lever, for peeling the protective tape portion off the tape intermittently fed by said tape feed means; and a chip takeout means for taking out the chip parts from the tape, from which the protective tape has been peeled off;

wherein said driving source and said chip takeout means are, respectively, a driving source and a chip takeout means for the chip mounter itself, and said working lever is interlocked in operation with the chip mounter; and wherein the tape includes a chip parts holding portion and said tape feed means is a tape feed pawl interlockingly connected to said second arm portion of the working lever, a portion of said tape feed pawl is in abutting contact with a shutter member covering a section of the chip part holding portion in a manner to prevent the chip parts from dislodgement from the chip parts holding portion of the tape, from which the protective tape has been peeled off, so as to bias the shutter member against a biasing force of a spring in a direction to cover the section of the chip parts holding portion.

2. The chip feeder for chip mounter as set forth in claim 1, wherein said protective tape peel-off means includes:

a working pawl interlockingly connected to said third arm portion of the working lever;

a ratchet wheel engaged with said working pawl, being rotatable intermittently only in one direction; and a protective tape take-up reel connected to said ratchet wheel, for peeling off the protective tape from the tape by a predetermined length and taking up the peeled off protective tape in an operation interlocked with the intermittent rotation of said ratchet wheel.

3. The chip feeder for chip mounter as set forth in claim 1, wherein said driving source is a fluidal pressure cylinder device including a piston rod, for driving said chip mounter, and a working head is interlockingly connected to a piston rod of said fluidal pressure cylinder device, and said first arm portion of the working lever is applied with a driving force from said working head.

4. The chip feeder for chip mounter as set forth in claim 1, wherein said first, said second and said third arm portions of the working lever extend, making an angle of about 120° with one another.

5. A chip feeder for chip mounter for supplying a multiplicity of chip parts retained on a tape, including a protective tape portion, from a tape supply section to a chip parts takeout section of said chip mounter, comprising:

a working lever having a first, a second and a third arm portion;

a driving source for applying a driving force to said first arm portion of the working lever;

a tape feed means interlockingly connected to said second arm portion of the working lever, for intermittently feeding the tape at a predetermined pitch;

a protective tape peel-off means interlockingly connected to said third arm portion of the working lever, for peeling the protective tape portion off the tape intermittently fed by said tape feed means; and a chip takeout means for taking out the chip parts from the tape, from which the protective tape has been peeled off;

wherein said driving source and said chip takeout means are, respectively, a driving source and a chip takeout means for the chip mounter itself, and said working lever is interlocked in operation with the chip mounter; and wherein said tape that is intermittently fed by the tape feed means is clamped at upper and under surfaces thereof and guided while being clamped by a fixed guide means on the upper surface thereof and a movable guide means on the under surface thereof, respectively, and said movable guide means is supported by a resilient means flexing in a tape feeding direction in accordance with the thickness of said tape.

6. The chip feeder for chip mounter as set forth in claim 5, including a guide block having end portions and an adjusting block having end portions, spaced from the guide block, and wherein said resilient means includes a pair of sheet springs inclined in the tape feeding direction, and the sheet springs have top ends connected to the end portions of the guide block and bottom ends connected to the end portions of the adjusting block.

7. The chip feeder for chip mounter as set forth in claim 6, wherein said pair of sheet springs, said guide blocks and said adjusting blocks form a parallelogrammatic shape.

8. The chip feeder for chip mounter as set forth in claim 5, wherein said protective tape peel-off means includes:

a working pawl interlockingly connected to said third arm portion of the working lever;

a ratchet wheel engaged with said working pawl, being rotatable intermittently only in one direction; and a protective tape take-up reel connected to said ratchet wheel, for peeling off the protective tape from the tape by a predetermined length and taking up the peeled off protective tape in an operation interlocked with the intermittent rotation of said ratchet wheel.

9. The chip feeder for chip mounter as set forth in claim 5, wherein said driving source is a fluidal pressure cylinder device including a piston rod, for driving said chip mounter, and a working head is interlockingly connected to a piston rod of said fluidal pressure cylinder device, and said first arm portion of the working lever is applied with a driving force from said working head.

10. The chip feeder for chip mounter as set forth in claim 5, wherein said first, said second and said third arm portions of the working lever extend, making an angle of about 120° with one another.

* * * * *